United States Patent
Graf et al.

(10) Patent No.: US 9,508,690 B2
(45) Date of Patent: Nov. 29, 2016

(54) SEMICONDUCTOR TSV DEVICE PACKAGE FOR CIRCUIT BOARD CONNECTION

(71) Applicant: International Business Machines Corporation, Armonk, NY (US)

(72) Inventors: Richard S. Graf, Gray, ME (US); David J. West, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/878,917

(22) Filed: Oct. 8, 2015

(65) Prior Publication Data

US 2016/0035693 A1    Feb. 4, 2016

Related U.S. Application Data

(63) Continuation of application No. 14/445,693, filed on Jul. 29, 2014.

(51) Int. Cl.
| | |
|---|---|
| *H01L 25/065* | (2006.01) |
| *H01L 25/10* | (2006.01) |
| *H01L 23/498* | (2006.01) |
| *H01L 25/00* | (2006.01) |
| *H01L 23/31* | (2006.01) |
| *H01L 23/00* | (2006.01) |

(52) U.S. Cl.
CPC ..... *H01L 25/0657* (2013.01); *H01L 23/49816* (2013.01); *H01L 23/49833* (2013.01); *H01L 25/105* (2013.01); *H01L 25/50* (2013.01); *H01L 23/3128* (2013.01); *H01L 24/05* (2013.01); *H01L 24/06* (2013.01); *H01L 24/13* (2013.01); *H01L 24/16* (2013.01); *H01L 24/17* (2013.01); *H01L 24/73* (2013.01); *H01L 24/92* (2013.01); *H01L 2224/0401* (2013.01); *H01L 2224/0557* (2013.01); *H01L 2224/06181* (2013.01); *H01L 2224/131* (2013.01); *H01L 2224/13025* (2013.01); *H01L 2224/13147* (2013.01); *H01L 2224/16227* (2013.01); *H01L 2224/1703* (2013.01); *H01L 2224/17181* (2013.01); *H01L 2224/48227* (2013.01); *H01L 2224/73204* (2013.01); *H01L 2224/92125* (2013.01); *H01L 2225/06513* (2013.01); *H01L 2225/06517* (2013.01); *H01L 2225/06541* (2013.01);

(Continued)

(58) Field of Classification Search
None
See application file for complete search history.

(56) References Cited

U.S. PATENT DOCUMENTS

| | | |
|---|---|---|
| 7,317,256 B2 | 1/2008 | Williams et al. |
| 7,390,700 B2 | 6/2008 | Gerber et al. |

(Continued)

OTHER PUBLICATIONS

3D IC Technology, Short Course, IEEE SOI-3D Subthreshold Microelectronics Unified Conference, Monterey California Oct. 7-10, 2013.*

(Continued)

*Primary Examiner* — Joseph Schoenholtz
(74) *Attorney, Agent, or Firm* — Damion Josephs

(57) ABSTRACT

An electronic device includes a circuit board and a semiconductor device package. The semiconductor device package includes a laminate layer. The semiconductor device package includes a semiconductor die having an active side, an inactive side opposite the active side, and through-silicon vias (TSVs) conductively connecting the active side to the inactive side and conductively connecting the semiconductor die to one of the laminate layer and the circuit board. The semiconductor device package includes a laminate layer having a side attached to the active side or the inactive side semiconductor die. The semiconductor device package includes solder balls at the side of the laminate layer attached to the semiconductor die, around the semiconductor die, and attached to the circuit board.

17 Claims, 4 Drawing Sheets

(52) U.S. Cl.
CPC ............... *H01L2225/06548* (2013.01); *H01L 2225/06572* (2013.01); *H01L 2225/107* (2013.01); *H01L 2225/1023* (2013.01); *H01L 2225/1041* (2013.01); *H01L 2924/1431* (2013.01); *H01L 2924/15311* (2013.01); *H01L 2924/15321* (2013.01); *H01L 2924/15331* (2013.01)

(56) References Cited

U.S. PATENT DOCUMENTS

| | | | |
|---|---|---|---|
| 7,923,290 | B2 | 4/2011 | Ko et al. |
| 8,004,073 | B2 | 8/2011 | Ko et al. |
| 8,217,502 | B2 | 7/2012 | Ko |
| 8,344,512 | B2 | 1/2013 | Knickerbocker |
| 8,466,567 | B2 | 6/2013 | Choi et al. |
| 8,518,752 | B2 | 8/2013 | Yang et al. |
| 2009/0072375 | A1 | 3/2009 | Song et al. |
| 2009/0127688 | A1 | 5/2009 | Lee et al. |
| 2010/0327439 | A1 | 12/2010 | Hwang et al. |
| 2012/0068319 | A1* | 3/2012 | Choi .................. H01L 25/16 257/676 |
| 2012/0074586 | A1* | 3/2012 | Seo .................. H01L 25/16 257/774 |
| 2013/0175705 | A1 | 7/2013 | Lin et al. |
| 2013/0277841 | A1 | 10/2013 | Lii et al. |
| 2016/0013153 | A1 | 1/2016 | Meyer |
| 2016/0035701 | A1 | 2/2016 | West et al. |

OTHER PUBLICATIONS

Okuno, T., "Solder Material Technology for Emedded Package" SiP Global Summit 2013, Sep. 6, 2013.*

Mulder, J. , Dillion, P., "Through Silicon Via (TSV) Technology Status" 3rd NASA Electronic Parts and Packaging (NEPP) Electronics Technology Workshop (ETW), NASA Goddard Space Flight Center in Greenbelt, MD, Jun. 11-13, 2012.*

Li, J.F., "Introduction to 3D Integration Technology using TSV", Department of Electrical Engineering, National Central Universty, Taiwan, dowloaded from URL<http://www.ee.ncu.edu.tw/~jfli/vlsi2/lecture/ch07> on Apr. 4, 2016.*

Non-final office action for U.S. Appl. No. 14/445,693 dated Nov. 16, 2015, 19 pp.

Yoon, S.W., et al. "3D TSV mid-end processes and assembly/packaging technology", IMAPS—European Microelectronics and Packaging Conference (EMPC-2011), Sep. 12-15, 2011, Brighton, UK, 6 pp.

Okuno, T., "Solder Material Technology for Embedded Package", SiP Global Summit, Sep. 6, 2013, 76 pp.

Samsung Foundry, "3D TSV Technology & Wide IO Memory Solutions", downloaded from URL <http://www.samsung.com/us/business/oem-solutions/pdfs/Web_DAC2012_TSV_demo-ah.pdf> on Nov. 9, 2015.

Das et al., "Package-interposer-package (PIP): a breakthrough package-on-package (PoP) technology for high end electronics," 61st Electronic Components and Technology Conference (ECTC), 2011, pp. 619-624.

Cheah et al., "A novel inter-package connection for advanced package-on-package enabling," 61st Electronic Components and Technology Conference (ECTC), 2011, pp. 589-594.

Farooq, M.G. et al., "3D Copper TSV Integration, Testing and Reliability", 2011 International Electron Devices Meeting.

Final office action for U.S. Appl. No. 14/445,693 dated May 6, 2016, 25 pp.

Notice of allowance for U.S. Appl. No. 14/445,693 dated Sep. 30, 2016, 12 pp.

* cited by examiner

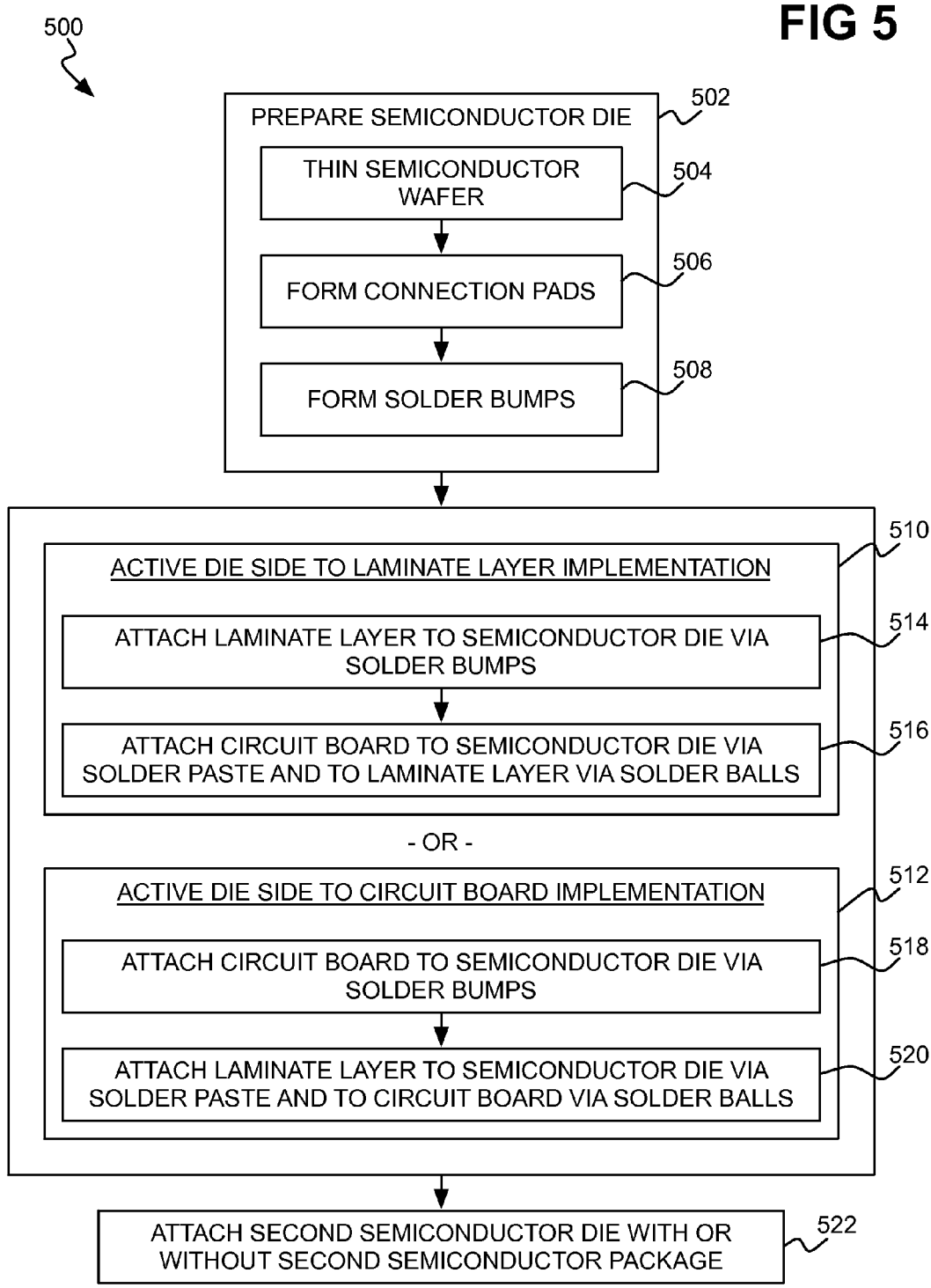

SEMICONDUCTOR TSV DEVICE PACKAGE FOR CIRCUIT BOARD CONNECTION

BACKGROUND

Electronic devices can include semiconductor dies mounted to circuit boards. The semiconductor dies are typically packaged. The resulting semiconductor device packages are then mounted to the circuit boards.

SUMMARY

An example semiconductor device package includes a semiconductor die having an active side, an inactive side opposite the active side, and through-silicon vias (TSVs) conductively connecting the active side to the inactive side. The semiconductor device package includes a laminate layer having a side attached to the semiconductor die at the active side thereof via solder bumps. The semiconductor device package includes solder balls at the side of the laminate layer attached to the semiconductor die, around the semiconductor die.

An example electronic device includes a circuit board and a semiconductor device package. The semiconductor device package includes a laminate layer. The semiconductor device package includes a semiconductor die having an active side, an inactive side opposite the active side, and TSVs conductively connecting the active side to the inactive side and conductively connecting the semiconductor die to one of the laminate layer and the circuit board. The semiconductor device package includes a laminate layer having a side attached to the semiconductor die. The semiconductor device package includes solder balls at the side of the laminate layer attached to the semiconductor die, around the semiconductor die, and attached to the circuit board.

An example method includes preparing a semiconductor die having an active side, an inactive side opposite the active side, and TSVs conductively connecting the active side to the inactive side. The method includes attaching a laminate layer to the semiconductor die. The method includes attaching a circuit board to the semiconductor die.

BRIEF DESCRIPTION OF THE SEVERAL VIEWS OF THE DRAWINGS

The drawings referenced herein form a part of the specification. Features shown in the drawing illustrate only some embodiments of the disclosure, and not of all embodiments of the disclosure, unless the detailed description explicitly indicates otherwise, and readers of the specification should not make implications to the contrary.

FIG. 4 is a diagram of an example electronic device including a semiconductor device package with a semiconductor die having TSVs attached to laminate layer of the package, and a circuit board attached to an active side of the die.

FIG. 5 is a flowchart of an example method for fabricating the electronic device of FIGS. 1, 2, 3, 4, and 5.

DETAILED DESCRIPTION

Figure 1:
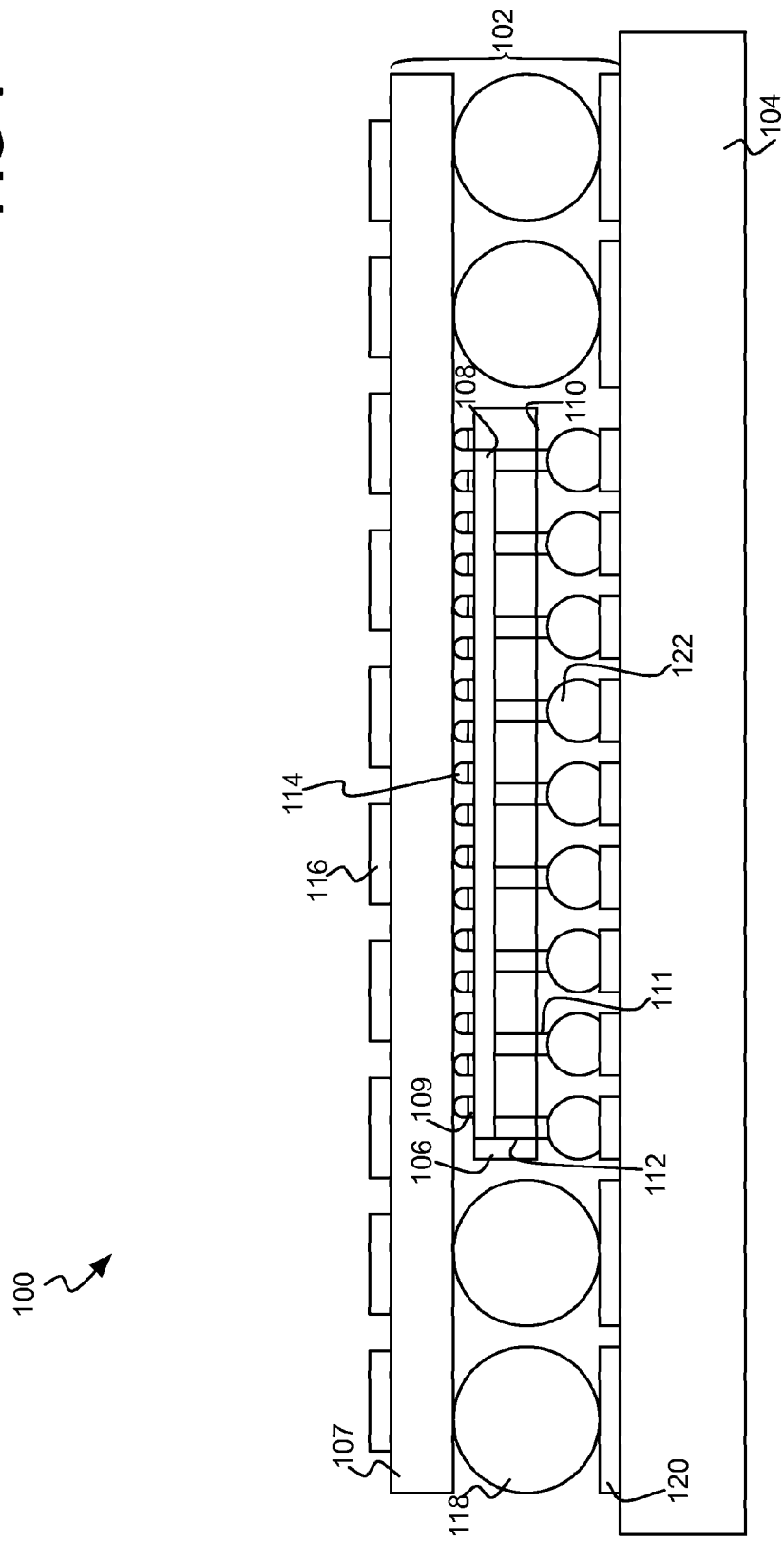
FIG. 1 is a diagram of an example electronic device including a semiconductor device package with a semiconductor die having through-silicon vias (TSVs) attached to a circuit board of the device.

The following detailed description of exemplary embodiments of the disclosure refers to the accompanying drawings that form a part of the description. The drawings illustrate specific exemplary embodiments in which the disclosure may be practiced. The detailed description, including the drawings, describes these embodiments in sufficient detail to enable those skilled in the art to practice the disclosure. Those skilled in the art may further utilize other embodiments of the disclosure, and make logical, mechanical, and other changes without departing from the spirit or scope of the disclosure.

As noted in the background section, electronic devices typically include semiconductor dies that are mounted to circuit boards after having been packaged. Semiconductor dies have become increasingly complex in their logic circuitry, as evidenced by the increasing number of transistors included in a given die. Furthermore, electronic devices, particularly mobile electronic devices, have become increasingly smaller. For instance, manufacturers have striven to make mobile electronic devices that are thinner than in the past.

Existing approaches for mounting semiconductor device packages to circuit boards, however, make it difficult to manufacture ever thinner electronic devices, particularly with the increasing complexity of semiconductor dies. For example, a so-called "flip chip" semiconductor device may have its semiconductor die's active side mounted to a laminar layer, which is then mounted to the circuit board. Solder balls around the device on the laminate layer connect the laminate layer to the circuit board, which conductively connect the active side of the semiconductor die to the circuit board through the laminate layer.

Exclusive reliance upon such solder balls is problematic, though. For complex semiconductor devices, the number of solder balls required may be large, necessitating a relatively large semiconductor device package. Furthermore, "chip on chip" technologies, in which semiconductor devices are stacked in a three-dimensional manner, may require an even larger number of such solder balls. In either case, sophisticated yet small and thin electronic devices are difficult to achieve.

Disclosed herein are techniques to overcome these shortcomings of conventional technologies. A semiconductor device package includes a semiconductor die having an active side and an inactive side. The laminate layer of the package can be attached to the active side of the die via solder bumps. The semiconductor die includes through-silicon vias (TSVs) to directly and conductively connect the die to a circuit board. As such, the number of solder balls between the laminate layer and the circuit board can be reduced, because at least some conductive connections that would otherwise have to be made via solder balls can instead by made using the TSVs. As another example, "chip on chip" technologies can be more easily provided for by, for instance, using at least some of the solder balls for the higher layer semiconductor dies.

FIG. 1 shows a portion of an example electronic device 100. The electronic device 100 includes a semiconductor device package 102 and a circuit board 104, which may be a printed circuit board (PCB). The semiconductor device package 102 includes a semiconductor die 106 and a laminate layer 107, which is the substrate to which the die 106 is mounted.

The semiconductor die 106 includes an active side 108 and an inactive side 110 that is opposite the active side 108. The active side 108 is the side of the die 106 containing the active logic circuitry, such as semiconductor transistors. The inactive side 110, by comparison, does not include any active logic circuitry; likewise, the laminate layer 107 is devoid of active semiconductor circuitry. The semiconductor die 106 includes a number of TSVs 112 extending through the die 106 at the inactive side 110 beginning at inactive-side connection pads 111 and connecting to the active logic circuitry at the active side 108. The TSVs 112 thus conductively connect the active side 108 to the inactive side 110.

In the example of FIG. 1, the laminate layer 107 is mounted at a side thereof to the active side 108 of the semiconductor die 106 at active-side connection pads 109 via solder bumps 114, which may be controlled collapse chip connection (C4) solder bumps. In other implementations, solder bumps 114 are augmented or replaced by copper pillars or a flip-chip interconnection. It is also noted that the solder bumps 114 are depicted in simplified fashion in FIG. 1 and the other figures for illustrative convenience and clarity, and in actuality may be compressed as opposed to spherical as depicted in the figures. The semiconductor device package 102 includes conductive lands 116 at the other side of the laminate layer 107 by which another semiconductor device package can be mounted in a "package on package" manner, or by which another semiconductor die can be mounted in a "double sided chip" manner. The semiconductor device package 102 also includes solder balls 118 on the side of the laminate layer 107 at which the layer 107 is attached to the die 106, around the semiconductor die 106. The solder balls 118 may be ball grid array (BGA) solder balls, for instance. Not shown in FIG. 1 is that the laminate layer 107 can include connection pads at locations to which the solder balls 118 and/or the solder bumps 114 are to attach.

The circuit board 104 includes conductive lands 120 for conductively connecting the semiconductor device package 102. Specifically, the laminate layer 107 is directly connected to the circuit board 104 via the solder balls 118 connecting to corresponding conductive lands 120. The TSVs 112 of the semiconductor die 106 are directly connected to the circuit board 104 at the inactive-side connection pads 111 via solder paste 122, which may be screened solder paste. Therefore, in the example of FIG. 1, the circuit board 104 is mounted to the inactive side 110 of the die 106. It is noted that the solder paste 122 is depicted in simplified and larger fashion in FIG. 1 and the other figures for illustrative convenience and clarity, and in actuality may be smaller and/or compressed as opposed to larger and spherical as depicted in the figures. It is also noted that the connection pads 111 can be larger width-wise than the TSVs 112 as compared as in FIG. 1 and the other figures.

The logic circuitry at the active side 108 of the semiconductor die 106 performs functionality by receiving power, and by receiving input and/or providing output. As such, the semiconductor die 106 includes power/ground lines to receive power, and signal lines to receive input and/or provide output. The signal lines may be connected via the TSVs 112 to the circuit board 104 and the power/ground lines connected via the solder balls 118 and through the laminate layer 107 to the circuit board 104 in one implementation. In this respect, the laminate layer 107 provides for signal routing, although as noted above the layer 107 itself has no active logic circuitry.

In another implementation, the power/ground lines may be connected via the TSVs 112 and the signal lines via the solder balls 118 and through the laminate layer 107. In a different implementation, at least some signal lines may be connected via the TSVs 112 and other signal lines via the solder balls 118 and through the laminate layer 107. Similarly, in one implementation, at least some power/ground lines may be connected via the TSVs 112 and other power/ground lines via the solder balls 118 and through the laminate layer 107.

It is noted that there can be an underfill layer to either side of the semiconductor die 106. Thus, there can be one underfill layer encapsulating the area surrounding the solder paste 122 from the bottom of the semiconductor die 106 to the top of the circuit board 104, and another underfill layer encapsulating the area surrounding the solder bumps 114 from the top of die 106 to the bottom of the laminate layer 107. In another implementation, there can be a single underfill layer extending from the top of the circuit board 104 to the bottom of the laminate layer 107, encapsulating the solder paste 122, the semiconductor die 106, and the solder bumps 114.

Figure 2:
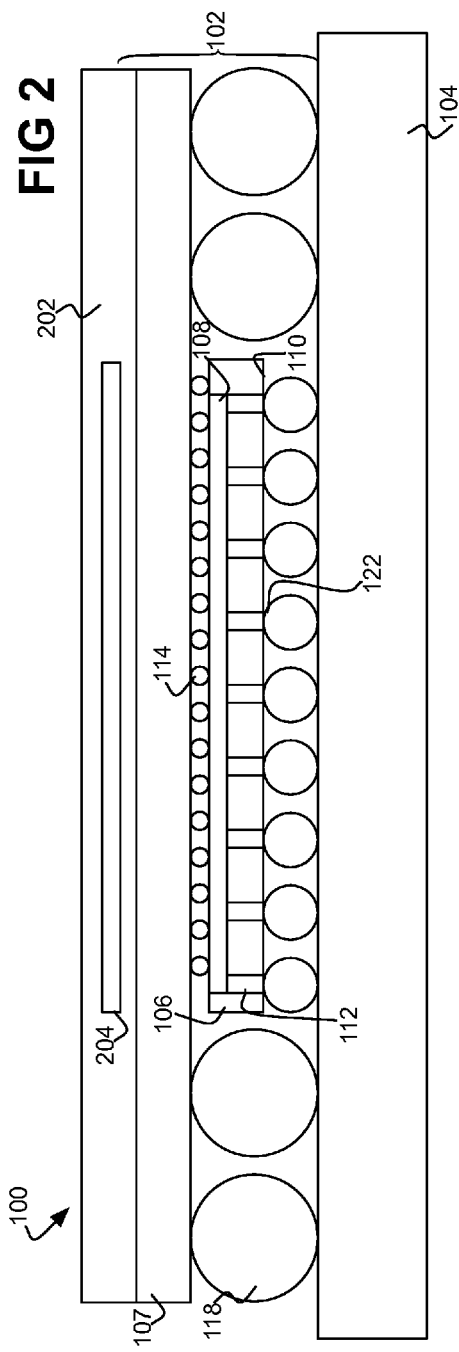
FIG. 2 is a diagram of an example electronic device including a semiconductor device package with a first semiconductor die having TSVs attached to a circuit board of the device, and a second semiconductor die conductively connected to the first laminate in a "double sided chip" manner.

FIG. 2 shows another example implementation of the electronic device 100. As in FIG. 1, the electronic device 100 in FIG. 2 includes the semiconductor device package 102 and the circuit board 104. Like-numbered parts of FIG. 2 are at least substantially identical in functionality as described with reference to FIG. 1, and their description with reference to FIG. 2 is omitted herein to avoid duplication. Furthermore, for illustrative clarity, certain components of FIG. 1 are omitted from FIG. 2 but can be present, such as the connection pads 109 and 111 and the conductive lands 116 and 120.

In FIG. 2, the electronic device 100 includes another semiconductor die 204 within an overmold layer 202. The overmold layer 202 is attached to the laminate layer 107 at the side of the layer 107 opposite the side at which the layer 107 is attached to the semiconductor die 106. The semiconductor die 204 can be conductively connected to (and thus through) the laminate layer 107 in a number of different ways to conductively expose the die 204 through the laminate layer 107. For instance, wirebonding within the overmold layer 202 can connect the die 204 to the laminate layer 107. As another example, the semiconductor die 204 can be disposed in a "flip chip" configuration to conductively connect to the laminate layer 107 via solder bumps within the overmold layer 202.

Figure 3:
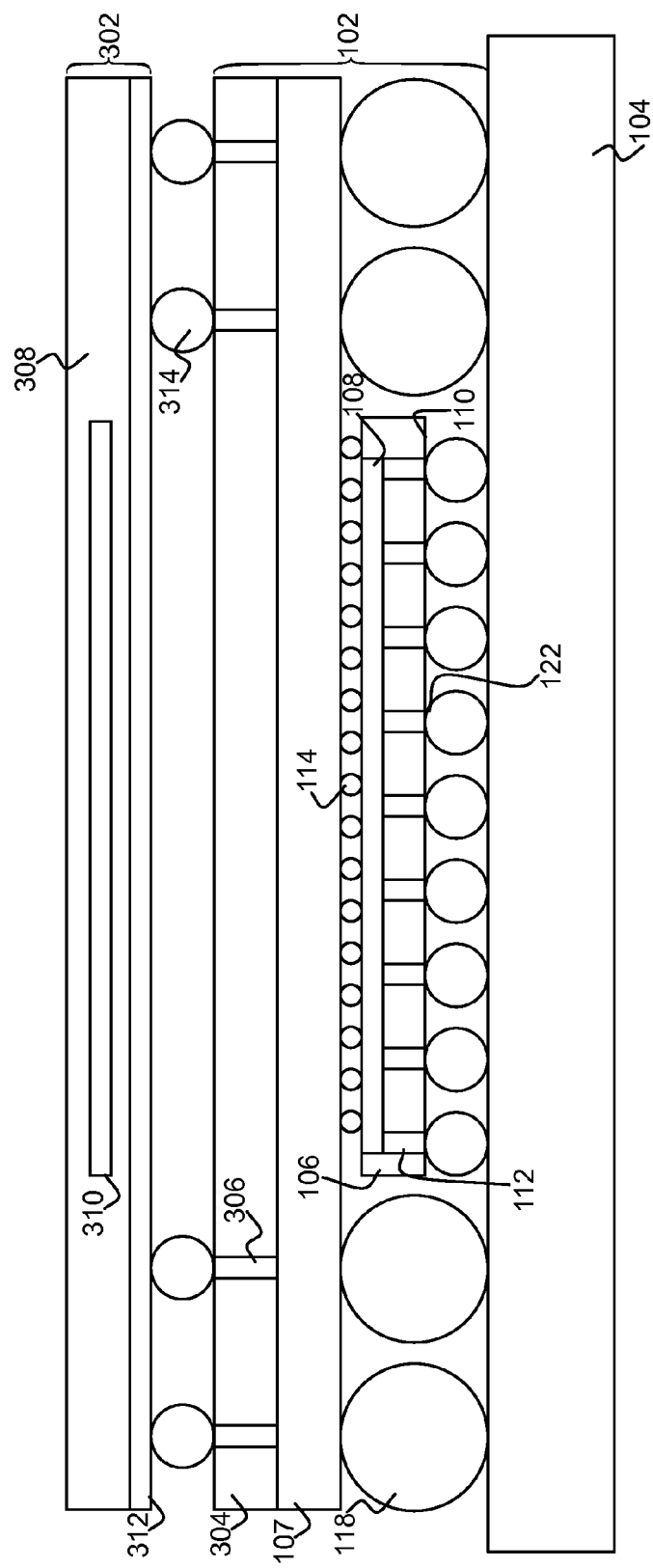
FIG. 3 is a diagram of an example electronic device including a first semiconductor device package with a semiconductor die having TSVs attached to a circuit board of the device, and a second semiconductor device package with another semiconductor die attached to the first package in a "package on package" manner.

FIG. 3 shows a third example implementation of the electronic device 100. As in FIG. 1, the electronic device 100 in FIG. 3 includes the semiconductor device package 102 and the circuit board 104. Like-numbered parts of FIG. 3 are at least substantially identical in functionality as described with reference to FIG. 1, and their description with reference to FIG. 2 is omitted herein to avoid duplication. Furthermore, for illustrative clarity, certain components of FIG. 1 are omitted from FIG. 2 but can be present, such as the connection pads 109 and 111 and the conductive lands 116 and 120.

In FIG. 3, the electronic device 100 includes another semiconductor device package 302 mounted to the semiconductor device package 102 in a "package on package"

configuration. The semiconductor device package 302 includes another semiconductor die 310 within an overmold layer 308, and a laminate layer 312. The semiconductor die 310 can be conductively connected to and through the laminate layer 312 via wirebonding within the overmold layer 308, via solder bumps within the overmold layer 308 when in a "flip chip" configuration, and so on, as has been described above with reference to FIG. 2.

In FIG. 3, the semiconductor device package 102 may include an overmold layer 304 that includes through-mold vias (TMVs) 306 to conductively connect the package 102 with the semiconductor device package 302 via solder balls 314. A third semiconductor die of the electronic device 100 can be included in the semiconductor device package 102, such that the semiconductor device package 102 can include two semiconductor dies as in FIG. 2 in one implementation. In another implementation, the third semiconductor die can be similar to the semiconductor die 106 and have TSVs to permit the semiconductor device package 102 to interconnect with the semiconductor device package 302 via solder bumps, in addition to via the solder balls 314 and the TMVs 306.

In the electronic device 100 in the example implementations of FIGS. 1, 2, and 3, the circuit board 104 connects to the inactive side 110 of the semiconductor die 106 of the semiconductor device package 102, whereas the active side 108 connects to the laminate layer 107 of the package 102. By comparison, FIG. 4 shows an example implementation of the electronic device 100 in which the circuit board 104 is connected to the active side 108 of the semiconductor die 106 of the semiconductor device package 102, and the inactive side 110 connects to the laminate layer 107 of the package 102. It is noted that the connection pads 109 and 111 and the conductive lands 116 and 120 are omitted from FIG. 4 for illustrative clarity and convenience, but can be present.

In FIG. 4, then, the circuit board 104 is mounted to the active side 108 of the semiconductor die 106 via the solder bumps 114. The laminate layer 107 is mounted to the TSVs 112 on the inactive side 110 of the semiconductor die 106 via the solder paste 122. The circuit board 104 is still mounted to the laminate layer 107 in FIG. 4 as in FIG. 2, via the solder balls 118. Thus, the circuit board 104 is conductively connected to the active side 108 of the semiconductor die 106 both directly (via the solder bumps 114) and indirectly (via the solder balls 118 and the laminate layer 107) in this implementation.

FIG. 5 shows an example method 500 for fabricating the electronic device of FIGS. 1, 2, 3, 4, and 5 that have been described. The semiconductor die 106 is first prepared (502). This includes thinning a semiconductor wafer including the die 106 and having the TSVs 112 embedded therein to expose the TSVs 112 (504), forming the connection pads 109 and 111 on the die 106 (506), and forming the solder bumps 114 at the active side 108 of the die 106 (508). Forming the connection pads 111 on the inactive side 110 can include forming a redistribution layer within which the pads 111 are formed.

In one implementation (e.g., FIGS. 1, 2, and 3), the active side 108 of the semiconductor die 106 is attached to the laminate layer 107, per part 510, whereas in another implementation (e.g., FIG. 4), the active side 108 is attached to the circuit board 104, per part 512. In the former implementation, first the laminate layer 107 is attached to the active side 108 of the semiconductor die 106 via the solder bumps 114 (514). Next, the circuit board 104 is attached to the inactive side 110 of the semiconductor die 106 via the solder paste 122 and to the laminate layer 107 via the solder balls 118 (516).

In the latter implementation, by comparison, first the circuit board 104 is attached to the active side 108 of the semiconductor die 106 via the solder bumps 114 (518). Next, the laminate layer 107 is attached to the semiconductor die 106 via the solder paste 122 and to the circuit board 104 via the solder balls 118 (516). Note that in both implementations, the laminate layer 107 and the circuit board 104 are attached to one another via the solder balls 118. In either implementation, another semiconductor die 204 within the semiconductor device package 102 can be attached as in FIG. 2, or another semiconductor device package 302 including another semiconductor die 310 can be attached as in FIG. 3 (522).

It is noted that, although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. As such and therefore, it is manifestly intended that this invention be limited only by the claims and equivalents thereof.

We claim:
1. A method comprising:
preparing a semiconductor die having an active side, an inactive side opposite the active side, and a plurality of through-silicon vias (TSVs) conductively connecting the active side to the inactive side, the active side including logic circuitry of the semiconductor die, the inactive side not including any logic circuitry of the semiconductor die;
attaching a laminate layer to the semiconductor die, the laminate layer being a substrate for the semiconductor die;
forming an overmold layer over the laminate layer and having a plurality of through-mold vias (TMVs);
attaching a circuit board to the semiconductor die, by employing a plurality of solder balls at a side of the laminate layer attached to the semiconductor die, around the semiconductor die, to attach the laminate layer to the circuit board; and
conductively connecting a semiconductor device package to the TMVs.

2. The method of claim 1, wherein the laminate layer is attached to the semiconductor die before the circuit board is attached to the semiconductor die,
wherein attaching the laminate layer to the semiconductor die comprises employing a plurality of solder bumps to attach a side of the laminate layer to the active side of the semiconductor die,
and wherein attaching the circuit board to the semiconductor die includes attaching the circuit board to the laminate layer further comprises:
employing solder paste to attach the circuit board to the inactive side of the semiconductor at which the TSVs are exposed.

3. The method of claim 1, wherein the laminate layer is attached to the semiconductor die after the circuit board is attached to the semiconductor die,
wherein attaching the circuit board to the semiconductor die comprises employing a plurality of solder bumps to attach the circuit board to the active side of the semiconductor die, and wherein attaching the laminate layer to the semiconductor die includes attaching the laminate layer to the circuit board further comprises:
employing solder paste to attach a side the laminate layer to the inactive side of the semiconductor die at which the TSVs are exposed.

4. The method of claim 1, wherein preparing the semiconductor die comprises:
thinning a semiconductor wafer including the semiconductor die and having the TSVs embedded therein to expose the TSVs;
forming a plurality of connection pads at the inactive side of the semiconductor die; and
forming a plurality of solder bumps at the active side of the semiconductor die.

5. The method of claim 4, wherein forming the connection pads at the inactive side comprises forming a redistribution layer within which the connection pads are formed.

6. The method of claim 1, wherein the semiconductor die is a first semiconductor die attached to a first side of the laminate layer, and the method further comprises:
attaching one or more of a second semiconductor die and a second semiconductor package to a second side of the laminate layer opposite the first side.

7. The method of claim 1, wherein the TSVs reduce a number of the solder balls required to attach the semiconductor device package to an external circuit board.

8. A method comprising:
preparing a first semiconductor device package having:
a first laminate layer;
a first semiconductor die having an active side, an inactive side opposite the active side, and a plurality of through-silicon vias (TSVs) conductively connecting the active side to the inactive side and conductively connecting the first semiconductor die to one of the first laminate layer and a circuit board;
a plurality of solder balls at a side of the laminate layer attached to the first semiconductor die, around the first semiconductor die; and
a first overmold layer over the first laminate layer and having a plurality of through-mold vias (TMVs);
preparing a second semiconductor device package having:
a second laminate layer;
a second overmold layer over the second laminate layer;
a second semiconductor die within the second overmold layer and conductively exposed through the second laminate layer;
conductively connecting the second semiconductor device to the first semiconductor device package at least via the TMVs providing a circuit board; and
attaching the first semiconductor device package to the circuit board via the solder balls.

9. The method of claim 8, wherein the first semiconductor device package further has a plurality of exposed pads without overmold or TMVs.

10. A method comprising:
providing a circuit board; and
preparing a first semiconductor device package having:
a first laminate layer;
a first semiconductor die having an active side, an inactive side opposite the active side, and a plurality of through-silicon vias (TSVs) conductively connecting the active side to the inactive side, the active side including logic circuitry of the first semiconductor die, the inactive side not including any logic circuitry of the first semiconductor die, the first laminate layer being a substrate for the first semiconductor die;
a plurality of solder balls at the side of the first laminate layer attached to the first semiconductor die, around the first semiconductor die, and attached to a circuit board;
a first overmold layer over the first laminate layer and having a plurality of through-mold vias (TMVs); and
conductively connecting the first semiconductor die of the first semiconductor device package via the TSVs to one of the first laminate layer and the circuit board;
conductively connecting a second semiconductor device package to the first semiconductor device package at least via the TMVs.

11. The method of claim 10, wherein the first laminate layer is attached to the first semiconductor die at the active side thereof via a plurality of solder bumps,
and wherein the method further comprises:
attaching the first semiconductor die to the circuit board at the inactive side via solder paste conductively connected between the circuit board and the TSVs.

12. The method of claim 10, wherein the first semiconductor device package further has a second semiconductor die within the first overmold layer and conductively connected to the first laminate layer.

13. The method of claim 10, wherein the first laminate layer is attached to the first semiconductor die at the inactive side thereof via solder paste conductively connected between the first laminate layer and the TSVs,
and wherein the method further comprises:
attaching the first semiconductor die to the circuit board at the active side via a plurality of solder bumps.

14. The method of claim 10, wherein the first semiconductor device package further has a plurality of exposed pads without overmold or TMVs.

15. The method of claim 10, wherein the second semiconductor device package has a second laminate layer.

16. The method of claim 15, wherein the second semiconductor device package further has a second overmold layer over the second laminate layer.

17. The method of claim 16, wherein the second semiconductor device package further has a second semiconductor die within the second overmold layer and conductively exposed through the second laminate layer.

* * * * *